United States Patent
Stivers

(10) Patent No.: US 7,171,637 B2
(45) Date of Patent: Jan. 30, 2007

(54) TRANSLATION GENERATION FOR A MASK PATTERN

(75) Inventor: Alan R. Stivers, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 11/035,928

(22) Filed: Jan. 14, 2005

(65) Prior Publication Data

US 2006/0190911 A1 Aug. 24, 2006

(51) Int. Cl.
*G06F 17/50* (2006.01)
(52) U.S. Cl. .................... 716/3; 716/2; 716/19
(58) Field of Classification Search ............... 716/21, 716/2, 3, 19
See application file for complete search history.

(56) References Cited

U.S. PATENT DOCUMENTS

| | | | |
|---|---|---|---|
| 4,849,804 A * | 7/1989 | Mader .................. 257/798 |
| 6,483,937 B1 * | 11/2002 | Samuels ................ 382/144 |
| 6,542,237 B1 * | 4/2003 | Kyoh et al. ............ 356/401 |
| 6,700,095 B2 | 3/2004 | Sandstrom et al. |
| 6,765,673 B1 * | 7/2004 | Higashikawa ........... 356/399 |
| 2004/0009408 A1 | 1/2004 | Fisch et al. |
| 2004/0124174 A1 | 7/2004 | Yan et al. |
| 2004/0126670 A1 | 7/2004 | Liang et al. |
| 2004/0151988 A1 | 8/2004 | Silverman |

* cited by examiner

*Primary Examiner*—Paul Dinh
*Assistant Examiner*—Suresh Memula
(74) *Attorney, Agent, or Firm*—Schwabe, Williamson & Wyatt, P.C.

(57) ABSTRACT

Generation of one or more translations is described. The generated translations may be applied to a mask pattern so that the pattern may be moved to cover one or more mask defects in part or in totality.

21 Claims, 7 Drawing Sheets

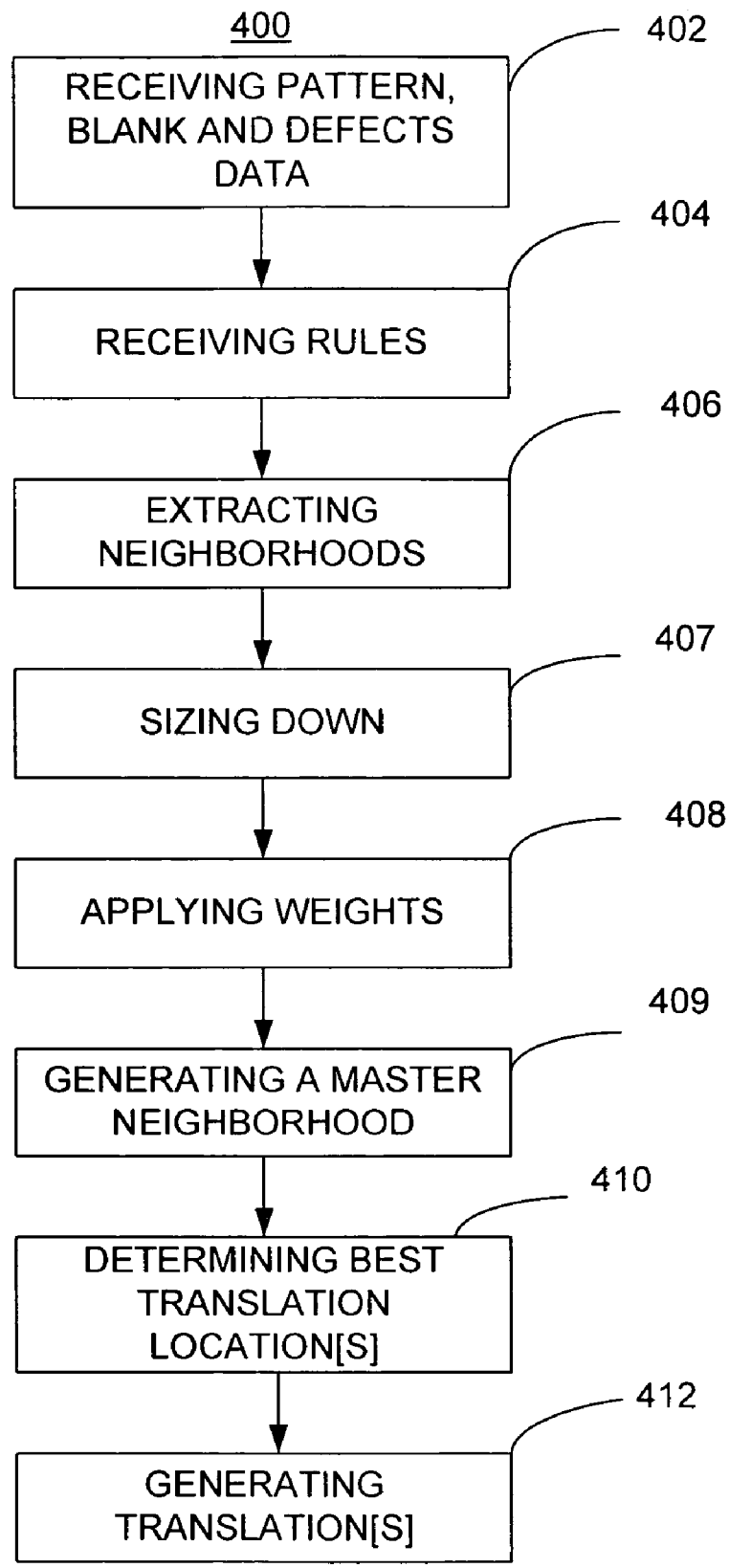

TRANSLATION GENERATION FOR A MASK PATTERN

BACKGROUND OF THE INVENTION

1. Field of the Invention

Embodiments of the present invention relate to, but are not limited to, electronic device manufacturing, and in particular, to the field of photolithography employing patterned masks.

2. Description of Related Art

In the field of integrated circuit (IC) manufacturing, a process known as photolithography is typically employed in order to form circuitry features onto, for example, a silicon wafer. In the process, an exposure operation is performed whereby selective portions of a photoresist film that is disposed on the wafer surface is exposed to electromagnetic radiation. The type of electromagnetic radiation used will depend upon the sizes of the circuitry features being formed. Typically, the smaller the size of the circuitry features being formed, the shorter the wavelengths of the electromagnetic radiation will be.

The current trend is to build IC with smaller and smaller circuitry features. As the circuitry features become smaller, the wavelengths of the electromagnetic radiation used in the photolithography process is likewise becoming smaller. In fact, electromagnetic radiation at the low end of the spectrum such as deep ultraviolet (DUV) radiation, which is radiation having wavelengths in the range of 125 to 250 nanometers (nm) and even extreme ultraviolet (EUV) radiation, which is radiation having wavelengths around 13.5 nm, are currently being investigated for use in photolithography processes for forming very small circuitry features.

In order to selectively expose only certain portions of the photoresist film to electromagnetic radiation, the radiation is transmitted to the photoresist film using a patterned mask. Depending on the specifics, the patterned mask used may be a transmissive type or a reflective type of patterned mask. For example, when the photolithography process is employing EUV, the patterned mask used in the process will typically be a reflective type of patterned mask.

Reflective types of patterned mask are typically formed by forming a pattern of absorptive material on top of a blank mask (herein "blank"). The blank typically includes a base substrate layer, a reflective multilayer and other layers such as buffer layers. The pattern is formed on the blank by first depositing a layer of radiation absorption material on top of the blank. The layer of absorption material is then patterned using, for example, an electron beam mask pattern generator (herein "electron beam generator"). The electron beam generator is typically controlled by some sort of control or computer device that includes a processor coupled to a memory device containing topography data of the pattern to be formed.

One problem currently faced by IC manufacturers is the problem of mask defects (herein "defects") that may be present in the patterned masks. These defects include multilayer defects that are embedded within the mask itself. The presence of defects may produce unwanted shadows and/or dispersion of the exposure radiation, which may reduce manufacturing yields. Unfortunately, removing defects that are present in the masks is often extremely difficult, particularly multilayer defects.

BRIEF DESCRIPTION OF DRAWINGS

Embodiments of the present invention will be described by way of exemplary embodiments, but not limitations, illustrated in the accompanying drawings in which like references denote similar elements, and in which:

FIG. 4 illustrates a process for generating one or more translations in accordance with some embodiments;

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not all required in order to practice the disclosed embodiments of the present invention.

The following description includes terms such as on, onto, on top, underneath, underlying, downward, lateral, and the like, that are used for descriptive purposes only and are not to be construed as limiting. That is, these terms are terms that are relative only to a point of reference and are not meant to be interpreted as limitations but are, instead, included in the following description to facilitate understanding of the various aspects of the invention.

Various operations will be described as multiple discrete operations in a manner that is most helpful in understanding these embodiments; however, the order of description should not be construed as to imply that these operations are necessarily order dependent. In particular, these operations need not be performed in the order of presentation.

According to various embodiments of the invention, methods, and systems for generating one or more translations for optimally locating an absorption pattern on a blank to cover a predetermined set of defects of arbitrary location, size, and importance with the absorption portions of the pattern, in part or in totality. Absorption pattern may also be referred to as mask pattern. The embodiments may make use of known constraints in order to reduce the amount of data that needs to be handled. These embodiments may generate one or more translations that may be applied to pattern data, which may result in the pattern being advantageously located on the blank. As defined here, a translation may be expressed, for example, as a vector that may be applied to an initial first location of a pattern so that a second more optimal location for the pattern may be obtained.

Figure 1:
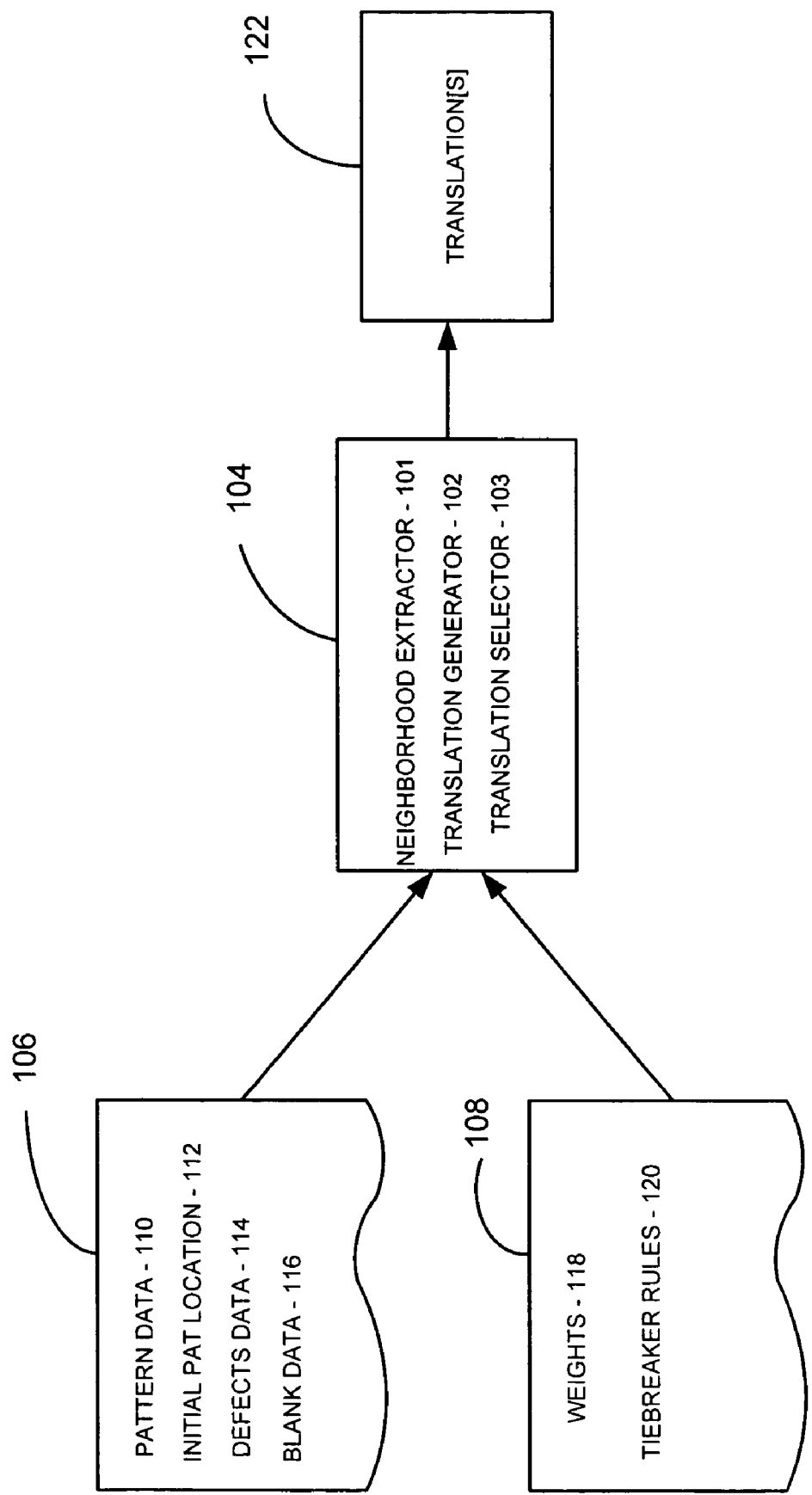
FIG. 1 illustrates a block diagram of the present invention, in accordance with some embodiments.

FIG. 1 depicts an overview of the present invention in accordance with some embodiments. As illustrated, embodiments of the invention may include a pattern planner 104 that includes various modules such as a neighborhood extractor 101, a translation generator 102, and an optional translation selector 103. In order to practice the invention, certain data such as defect sizes, shapes and locations, mask dimensions, pattern topography, and other relevant data may be initially provided and/or received in the course of processing, when needed.

In brief, the neighborhood extractor 101, in various embodiments, may extract one or more pattern neighborhoods (herein "neighborhoods") from a pattern to be formed on a blank. Each of the extracted neighborhoods may be associated with each of the defects that are located on the blank to be patterned. The translation generator 102 may be equipped to size down each of the extracted neighborhoods and to sum all of the extracted neighborhoods, generating, if possible, a master neighborhood. The translation generator 102 may further scan the master neighborhood to identify the best or optimal location or locations (relative to a set of preferences) to generate one or more translations 122. The best/optimal location or locations on the master neighborhood may be the location or locations where the most or greatest number of defect coverage occurs or where at least the relatively more important defects are covered or more covered. A more detailed description of the concept of best/optimal locations is provided below.

The one or more generated translations 122 when applied to a pattern may optimally locate the pattern in order to cover the maximum number of defects and/or to cover at least the more relevant defects with the absorption portions of the pattern. The translation selector 103 may be employed in order to automatically select a translation when two or more translations are generated that are "equally good." Note that in other embodiments, the translation selector 103 may not be employed, in which case the pattern planner 104 may generate a plurality of translations 122 and a translation may be arbitrarily selected from the plurality of translation. In some embodiments, the pattern planner 104 may include other modules. In still other embodiments, the various modules (e.g., the neighborhood extractor 101, a translation generator 102, and a translation selector 103) may each be stand-alone applications.

As illustrated, in order to generate one or more translations 122, the pattern planner 104 may take pattern and blank data 106 and design rules 108 as input. In particular, the pattern and blank data 106 includes pattern data 110, initial pattern location 112, defects data 114, and blank data 116. The design rules 108 may include, among other things, weights 118 and tiebreaker rules 120.

In response to the inputs, pattern planner 104 processes the inputs and generates one or more translations. As described above if more than one translation of equal values are generated, the pattern planner 104 (in particular, the translation selector 103) may select one of the equal value translations as the optimal translation. The selected translation or in the case where no specific translation is selected, the plurality of equal value translations, can be applied to the pattern providing a new pattern location that covers the mask defects.

In various embodiments, the pattern data 110 may include data relating to the topography of a mask pattern. The data may include the specific locations of the absorption portions of the pattern relative to the pattern itself. The pattern data 110 may be stored as a bitmap containing a plurality of pixels, each pixel may or may not be associated with the geometric features that represents the absorption portions of the pattern to be formed.

The initial pattern location 112 may be the starting location on the blank where the pattern may be set to be initially placed. The initial pattern location 112, in various embodiments, may be employed in order to facilitate the generation of translations. The initial pattern location 112 may be set at some arbitrary location on the blank but within the allowable area of the mask. That is, in some instances, certain portions of the blank such as the periphery portions of the blank may be unavailable for placing portions of the pattern. As a result, for these embodiments, the pattern may only be placed within the disallowed periphery portions of the mask. In some embodiments, the initial pattern location 112 may be centered on the blank (see FIG. 2).

The defects data 114 may provide specific locations or coordinates on the mask where mask or blank defects are present. In some embodiments, these locations may be defined by xy-coordinates. In order to identify these locations, the blank may be marked by fiducial marks, which may serve as reference points for locating the defects on the blank. The defects data 114 may further include the sizes and shapes of the defects.

The blank data 116 may provide information relating to the shape and size of the blank to be patterned. In particular, the blank data 116 may provide information relating to the area on the mask which a pattern may be formed. As described earlier, the entire mask may not be available for pattern placement. Certain portions, particularly the periphery portions of the mask, may be unavailable for pattern placement. Thus, the blank data 116 may identify the region or regions on the blank where a pattern may be located.

As briefly provided above, the design rules 108 provide constraints and rules on how the translations are to be generated and/or selected. These constraints and rules may include weights 118. In various embodiments, the weights 118 are weights of different values that are assigned to the extracted neighborhoods in order to, for example, give greater weights to neighborhoods that are associated with more relevant defects than other neighborhoods associated with defects of lessor importance. This may assure that the more important defects are covered by the pattern. Specifics on the role of the weights 118 and their use will be described in greater detail below.

The design rules 108, as described above, may also include tiebreaker rules 120. In various embodiments, the pattern planner 104 may use the tiebreaker rules 120 in order to select one translation from a group of two or more translations of "equal values." As defined here, two translations may be of equal value if the two translations were to be applied to a pattern and the pattern is located on the blank based on the translations such that, for example, an equal number of mask defects and/or mask defects of equal values are covered regardless of the translation applied. Tiebreaker rules 120 may include, for example, selecting the translation that requires the least amount of movement of the pattern. That is, if the equal valued translations are defined by vectors then the vectors may be defined by both distance and direction. Consequently, the rules may require that the translation having the smallest distance to be the translation to be selected. Other rules may include, for example, rules that select the translation that forces the pattern to move in a particular direction rather than in other directions. As with the other components described thus far, the tiebreaker rules 120 are not required for practicing the novel aspects of embodiments of this invention and may be omitted in some embodiments.

The teachings incorporated with the pattern planner 104 to generate one or more translations 122 will be described in more detail below. However, before doing so, the concepts of mask patterns, initial pattern location, defect locations, pattern neighborhoods, sized down, and the like, will first be described with references to FIGS. 2 and 3A to 3E.

Figure 2:
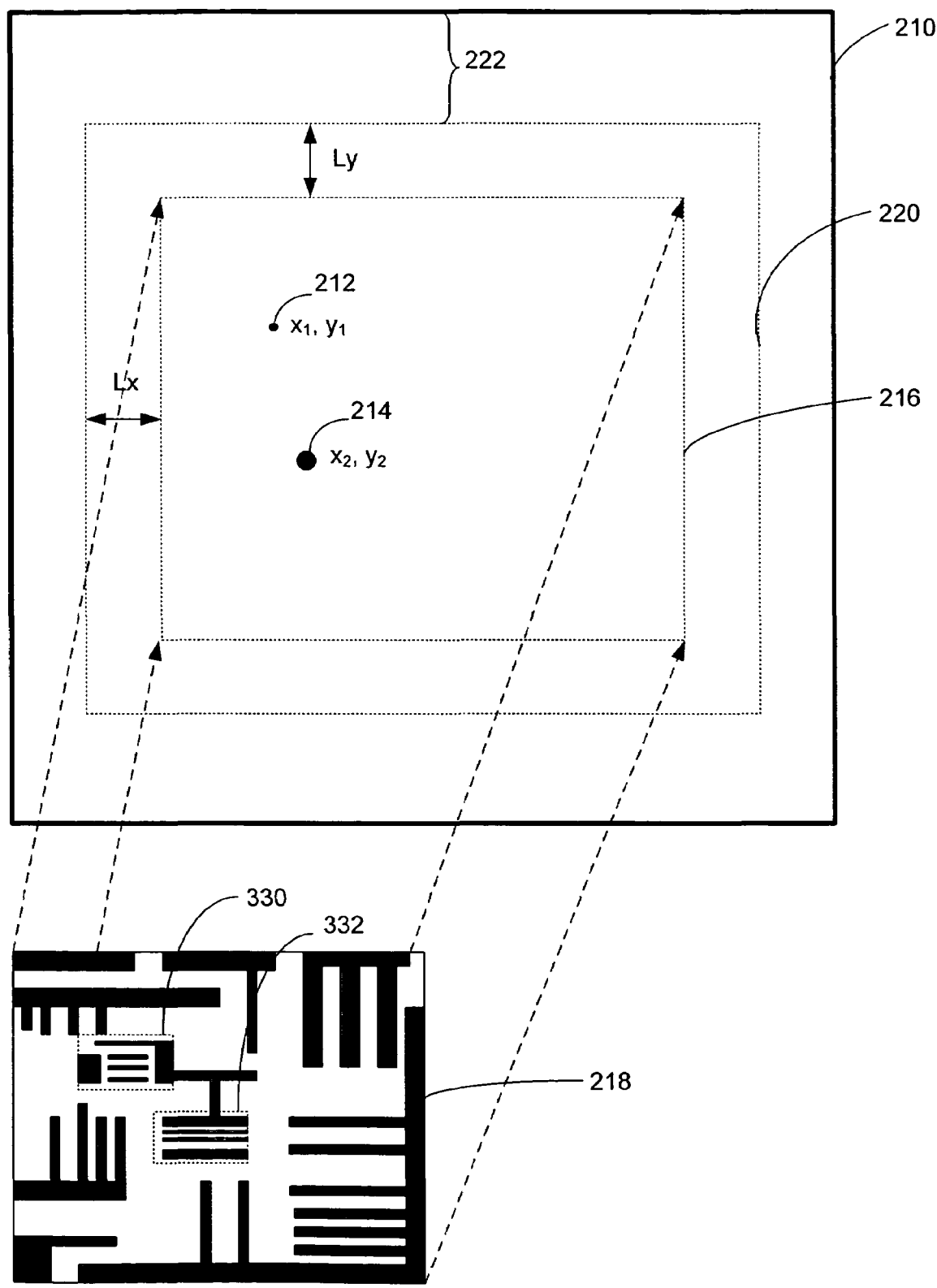
FIG. 2 illustrates an exemplary mask blank and a pattern to be placed on top of the mask blank.

In particular, FIG. 2 depicts an exemplary blank with two defects and a pattern to be formed on top of the blank. The two defects 212 and 214 may be multilayer defects that may be present in the blank 210. The blank 210, in some instances, may be a blank for an EUV mask adapted to receive and transmit EUV radiation. A first outline 220 is interposed on the blank 210 representing the area available for a pattern placement. That is, in this example, the periphery 222 of the blank 210 is not available for placing any portion of the pattern 218. A second outline 216 is interposed on top of the blank 210 indicating the outline of the pattern 218 if the pattern 218 were to be centrally located on the blank 210. Although in this embodiment, the pattern 218 is depicted as centered on the blank 210, the pattern 218 may actually be placed anywhere on the blank 210 so long as no portion of the pattern 218 protrudes out of the first outline 220. The pattern 218 is made of a plurality of geometric features and nongeometric features, the geometric features representing the absorption features of a mask pattern while the nongeometric features represent the transparent portions of the mask pattern.

Note that if the topography data of the mask pattern 218 is stored as a bitmap file comprising a plurality of pixels then each of the pixels may be assigned different values depending on whether the pixels represent portions of the geometric features or portions of the nongeometric features. For example, the pixels that are associated with geometric features (i.e., absorption portions of the pattern) may be assigned the value of one while those pixels that represent nongeometric features may be assigned the value of zero.

The horizontal and vertical distances ($L_x$ and $L_y$) depicted in FIG. 2 are the maximum horizontal and vertical distances available for shifting the pattern 210 without any portion of the pattern 210 protruding out of the first outline 220. The locations of the two defects 212 and 214 are extracted by the coordinates ($x_1,y_1$) and ($x_2,y_2$). Note that first defect 212 is smaller in size than the second defect 214.

Although in this illustration the blank 210, the first outline 220 (allowable pattern area) and the pattern 218 are all depicted as having rectangular shapes, these items may actually have other shape types. For example, the pattern 218 and the space available for the pattern (as shown by first outline 220) may actually have nonrectangular shapes. However, for purposes of simplicity, these items are depicted as having rectangular shapes.

Figure 3A:
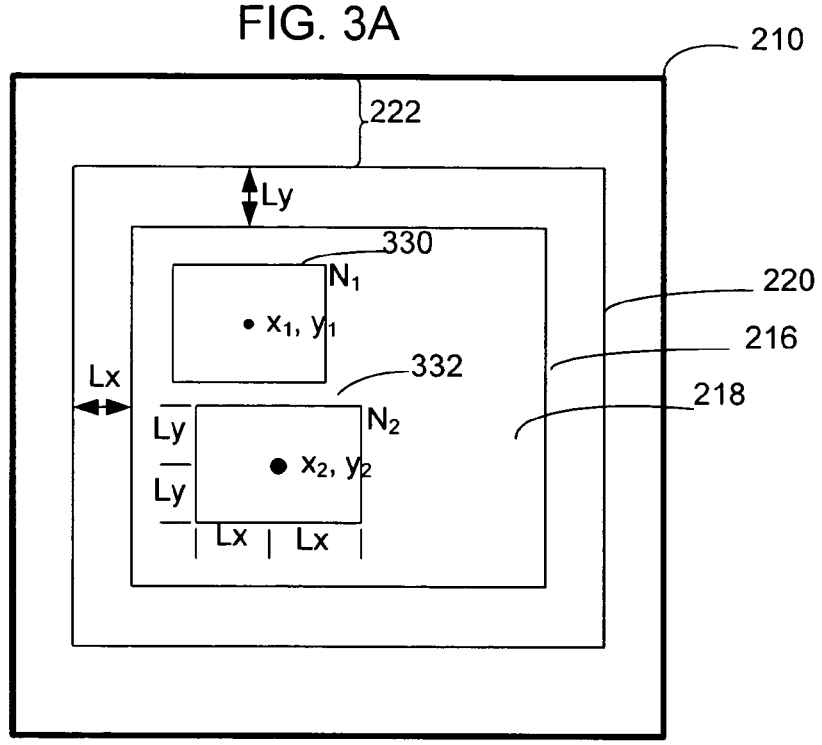
FIG. 3A illustrates two defects on the mask blank of FIG. 2.
Figure 3B:
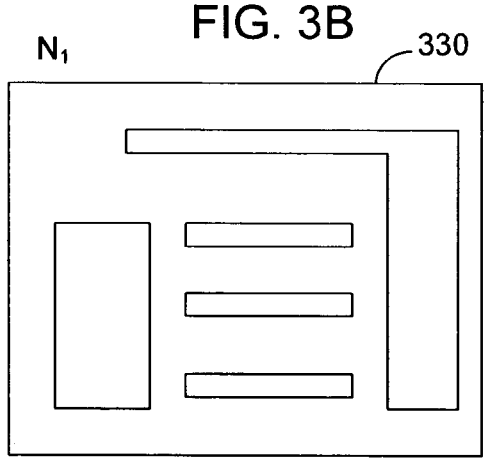
FIGS. 3B and 3C illustrate two pattern neighborhoods associated with the two defects of FIG. 3A.
Figure 3C:
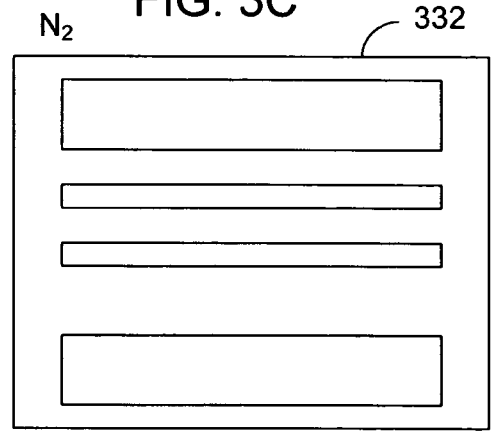

If the pattern 218 is centrally placed on the blank 210, as depicted in FIG. 2, two areas (see 330 and 332) of the pattern 218 will lie on top of the two defects 212 and 214. These two areas, for purposes of this description, will be called first and second neighborhoods 330 and 332. FIG. 3A depicts the outline of the two neighborhoods 330 and 332 over the two defects 212 and 214. A close-up view of the first and second neighborhoods 330 and 332 are depicted in FIGS. 3B and 3C (which are also depicted in FIG. 2). Referring back to FIG. 3A, each of the defects 212 and 214 are centered in each of the neighborhoods 330 and 332. The two neighborhoods 330 and 332 have the dimensions $2L_x$ and $2L_y$. This is because the $L_x$ and $L_y$ represents the maximum distances that the pattern 218 can be moved in the x and y directions without protruding out of the first outline 220 (or into the disallowed periphery 222). That is, if the entire pattern 218 were to be moved or "translated" to another location without intruding into the disallowed periphery 222, the two neighborhoods 330 and 332 represent the actual corresponding areas of the pattern 218 that can be used in order to "cover" the two defects 212 and 214. Since the allowable movement of the pattern 218 is constrained by $L_x$ in the x direction and $L_y$ in the y direction, the neighborhoods 330 and 332 can be defined by $x_i-L_x<x<x_i+L_x$ and $y_i-L_y<y<y_i+L_y$, where the location of the defects are ($x_i$, $y_i$).

Figure 3D:
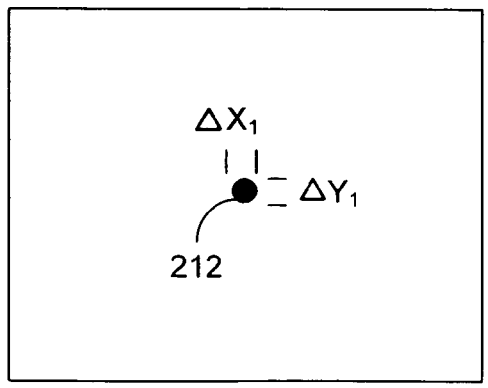
FIGS. 3D and 3E illustrate the two defects of FIG. 3A in further detail.
Figure 3E:
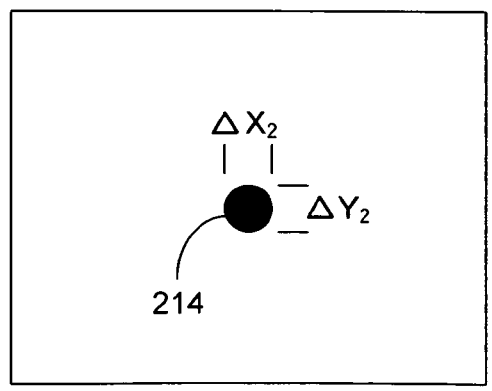

FIGS. 3D and 3E depicts the two defects 212 and 214 laid on top of the outlines of the two corresponding neighborhoods 330 and 332. Each of the two defects 212 and 214 are centered in their corresponding neighborhoods 330 and 332. The areas of the two defects 212 and 214 may be defined by ($\Delta X_1, \Delta Y_1$) and ($\Delta X_2, \Delta Y_2$), respectively.

FIG. 4 depicts the overall process for generating one or more translations that can be applied to a pattern in order to optimally place the pattern on a blank mask in accordance with some embodiments. For ease of understanding, the following description of the process 400 will be described with reference to the illustrations of FIGS. 2 and 3A to 3E. That is, the process 400 will be described in reference to the simplest case where only two blank defects are present and the pattern and the blank having simple rectangular shapes. However, the process 400 in various embodiments may be practiced when numerous defects are present and the pattern and/or blank having non-rectangular shapes.

For the embodiments, the process 400 may begin when pattern, blank and/or defects data are provided or received at block 402. The pattern data may include information on the specific locations and shapes of geometric features that represents the absorption portions of the pattern to be placed on the blank. The pattern data may further include the initial pattern location, which in some embodiments may be arbitrarily set. In other embodiments, however, the initial pattern location may be set at the center of the blank to be patterned (e.g., as depicted in FIG. 2). The blank data may include data relating to the specific size and shape of the blank to be patterned. The blank data may further include information that indicates areas on the mask where patterns are not allowed to be located (see periphery 222 of the mask in FIG. 2). The defects data may include data indicating the specific blank locations of defects. This data may be obtained using, for example, a high-speed blank inspection followed by precision EUV aerial imaging microscope metrology. The resulting data may include ($x_i$, $y_i$) coordinates of each of the defects. The identification of the locations of the defects may be facilitated by placing fiducial marks on the blank. That is, as described previously, fiducial marks may be placed on the blank to be patterned and the marks may be used as reference points in order to identify the precise locations of the defects.

In addition to receiving the pattern, blank, and defects data, design rules may be received at block 404. The design rules include, among other things, weights to be assigned to pattern neighborhoods and tiebreaker rules. The weights to be assigned to the neighborhoods may be related to the specific defect or defects associated with each of the neighborhoods.

Once the pattern, blank, and defects data has been received, pattern neighborhoods associated with each of the defects may be extracted at block 406. In the illustrated example of FIGS. 2 and 3A to 3E, the two neighborhoods 330 and 332 are the two neighborhoods that are associated with the two defects 212 and 214 when the initial location of the pattern 218 is set at the center of the blank 210.

Figure 5A:
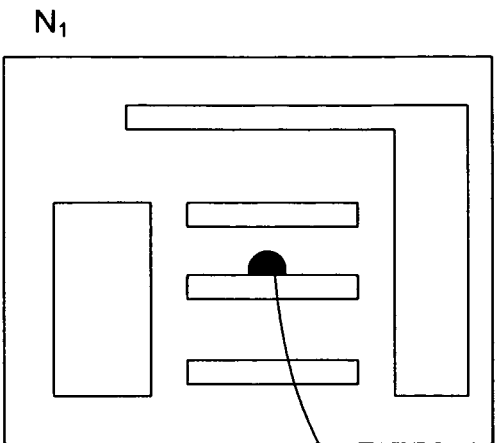
FIGS. 5A and 5B illustrate the two pattern neighborhoods of FIGS. 3B and 3C interposed on top of the two defects of FIGS. 3D and 3E, respectively, in accordance with some embodiments.
Figure 5B:
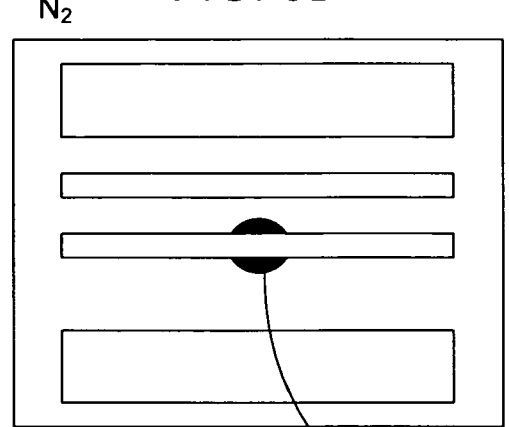

FIGS. 5A and 5B depict the two extracted pattern neighborhoods 330 and 332 interposed on top of the two defects 212 and 214. The two defects 212 and 214 are centered at each of their respective pattern neighborhoods 330 and 332. As previously described, the size and shape of the two neighborhoods 330 and 332 in reference to their respective defects 212 and 214 may be dependent upon the "wiggle room" allowed by $L_x$ and $L_y$ on either sides of the pattern 218. At this point, it should be noted that the topography of the overall pattern 218 as well as the neighborhoods 330 and 332 associated with each of the defects 212 and 214 may be stored as bitmap files. That is, if the overall pattern data (e.g., pattern 218) is stored as a bitmap file then the two neighborhoods may be kept separately (e.g., in a separate graphics layer or in a separate bitmap file). Mathematically, this may be expressed as $$x'_i = x - x_i$$

$$y'_i = y - y_i,$$

where $x'_i$ and $y'_i$ are the pattern coordinates in neighborhood $N_i$ relative to the coordinates $(x_i, y_i)$ of its associated defect.

Figure 6A:
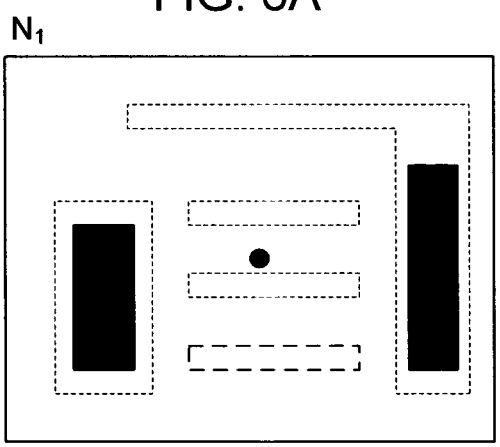
FIGS. 6A and 6B illustrate sized down versions of the two pattern neighborhoods of FIGS. 5A and 5B in accordance with some embodiments.
Figure 6B:
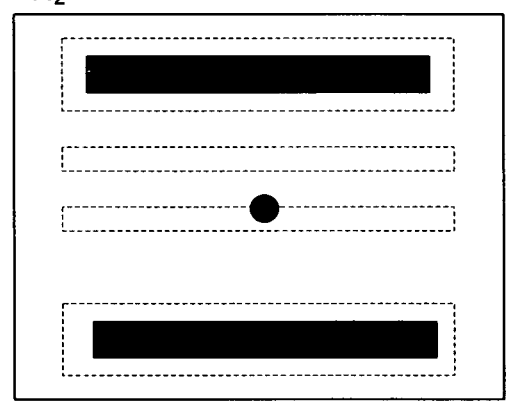

Returning to the process of FIG. 4, once the respective pattern neighborhoods have been extracted, the extracted neighborhoods $N_i$ (e.g., $N_1$ and $N_2$ in FIGS. 5A and 5B) may be sized down by the corresponding defect sizes at block 407. That is, the pattern or geometric features of each neighborhood $N_i$ may be sized down by the size of the defect associated with each of the neighborhoods. For example, the defects 212 and 214 may each be defined by $\Delta x_i$ in the x direction and $\Delta y_i$ in the y direction as depicted in FIGS. 3D and 3E. Based on the sizes of the defects 212 and 214, the geometric features of each of the neighborhoods 330 and 332 may be reduced or sized down by the same amounts $(\Delta x_i, \Delta y_i)$ as depicted in FIGS. 6A and 6B. This may eliminate geometric features in each of the neighborhoods 330 and 332 that are too small to cover their respective defects 212 and 214 leaving behind only those geometric features that will actually be able to cover their respective defects.

For the remaining geometric features, the sizing down of the neighborhoods 330 and 332, as depicted in FIGS. 6A and 6B, will force the translation or translations generated in subsequent operations to place the defects within the central sections of the remaining geometric features. Such placements will result in the defects being far enough away from the edges of the remaining geometric features to ensure complete coverage of the defects by the remaining geometric features. The size down of the neighborhoods 330 and 332 may further reduce the data file sizes of each of the neighborhoods.

As described previously, the neighborhoods may be stored as bitmap files. When stored in such a format, the bitmap files may be made up of rectangular pixels. Each of the pixels may be assigned either the value of one or zero. A pixel may be assigned the value of one if the pixel represents part of the pattern and the value of zero if it does not represent part of the pattern. In various embodiments, the pixel size may equal the native pixel size of a pattern generator such as an electron beam generator.

According to various embodiments, once each of the neighborhoods 330 and 332 have been sized down, one or more of the neighborhoods 330 and 332 may be multiplied by one or more weighting factors $w_i$ at block 408. The weighting factors $w_i$ may be associated with each of the defects 212 and 214 and may be employed in order to provide a preference for covering higher priority defects. For example, suppose it is more important to cover the first defect 212 than the second defect 214. A weighting factor $(w_1)$ of two may be assigned to the first defect 212 while a weighting factor $(w_2)$ of one may be assigned to the second defect 214. Each pixel in each of the corresponding neighborhoods 330 and 332 may be multiplied by their respective weighting factors (weighting factor of two for neighborhood 330 and a weighting factor of one for neighborhood 332).

The multiplication of the neighborhoods 330 and 332 with the weighting factors may assure that translation that favors the coverage of the first defect rather than the second defect is generated in subsequent operations. That is, this operation may allow the alignment to favor coverage of defects whose effects are difficult to mitigate in any way other than coverage. An example of such defects is phase defects. As with the other operations described, the multiplication of the neighborhoods with the weighting factors may be avoided in some embodiments.

Figure 7:
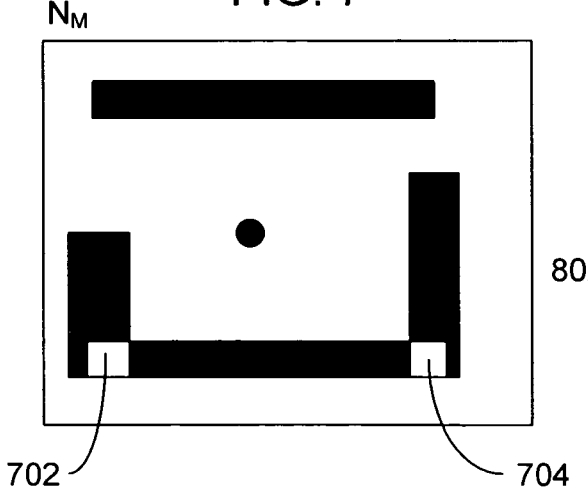
FIG. 7 illustrates a master pattern neighborhood formed from the two downsized pattern neighborhoods of FIGS. 6A and 6B in accordance with some embodiments.

Once each of the neighborhoods 330 and 332 have been sized down and multiplied by the weighting factors, the neighborhoods 330 and 332 may be summed or combined together to form a master neighborhood, $N_M$ at block 409. FIG. 7 depicts the master neighborhood of the two neighborhoods 330 and 332 of FIGS. 6A and 6B. In this example, there are two overlap locations or best locations 702 and 704 where geometric features from each of the neighborhoods overlap. That is, in this example, the highest value pixels in the master neighborhood will correspond to the greatest pattern overlap if the weighting factors are all equal (e.g., when $w_1 = w_2$ as is in the case of FIG. 7). If the weighting factors (e.g., $w_1 \neq w_2$) are not equal then the highest value pixels will typically represent the most significant overlap. In this illustration, the best locations 702 and 704 represents the two locations in the master neighborhood where both of the defects 212 and 214 can be completely covered. Thus, as described before, the best location or locations on the master neighborhood may be the location or locations where the greatest number of defect coverage occurs or where at least the more important defects are covered.

Figure 8:
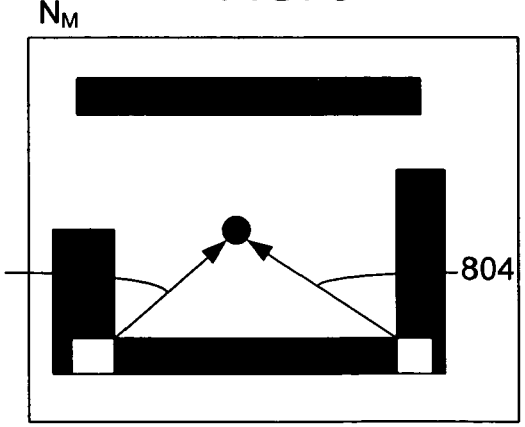
FIG. 8 illustrates two vectors formed from best locations of the master pattern neighborhood of FIG. 7 in accordance with some embodiments.
Figure 9A:
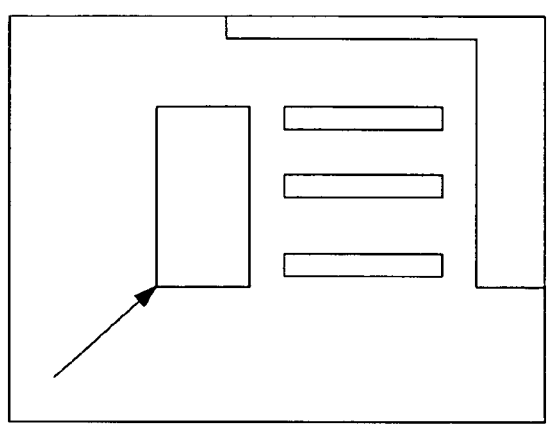
FIGS. 9A and 9B illustrate the relocation of the two pattern neighborhoods of FIGS. 3B and 3C by applying one of the vectors of FIG. 8 in accordance with some embodiments.
Figure 9B:
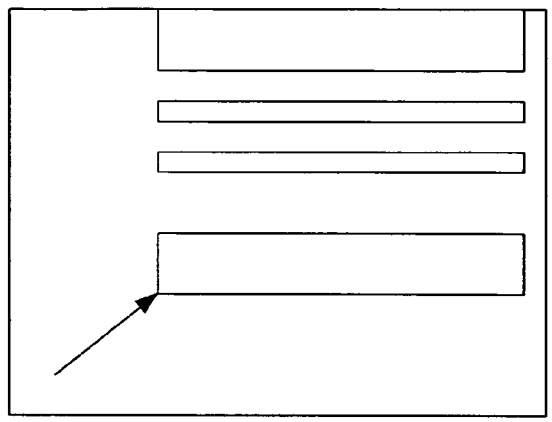
Figure 9C:
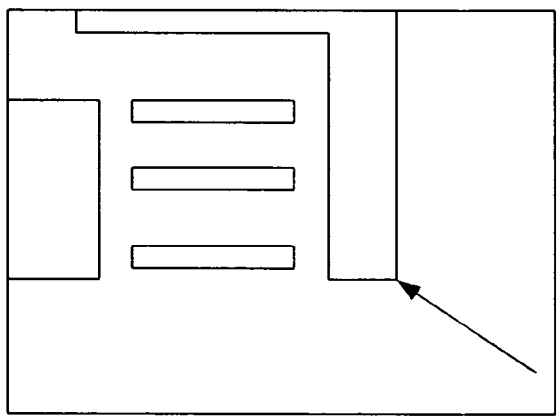
FIGS. 9C and 9D illustrate the relocation of the two pattern neighborhoods of FIGS. 3B and 3C by applying one of the vectors of FIG. 8 in accordance with some embodiments.
Figure 9D:
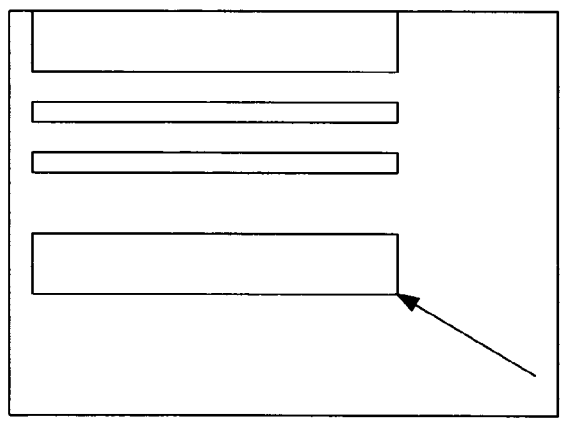

Once the master neighborhood has been formed, the best location or locations $(x_{opt}, y_{opt})$ on the master neighborhood may be determined at block 410. This may accomplish, for example, by scanning a number of candidate locations of the master neighborhood and determining the pixel or pixels with the highest values. Of course, the term "highest values" is a relative term that may also mean the highest negative value or other techniques for determining highest value. Based on the determination of the one or more highest value or best locations, among the candidate locations scanned, one or more translation vectors may be generated as shown in FIG. 8, which depicts two translation vectors 802 and 804 associated with the two best locations 702 and 704 depicted in FIG. 7. These vectors 802 and 804 may be applied to the overall pattern 218 to locate the pattern 218 on the blank 210 so that the two defects 212 and 214 are covered by the pattern 218. FIGS. 9A to 9D depicts the two neighborhoods 330 and 332 after the vectors 802 and 804 are applied to each of the respective neighborhoods. Alternatively, the database of the entire pattern 218 may be translated by $(-x_{opt}, -y_{opt})$ to place the pattern 218 to optimally cover the defects 212 and 214. Mathematically, this can be expressed as:

$$x'_i = x - x_{opt}$$

$$y'_i = y - y_{opt},$$

If more than one translation is generated as depicted in FIG. 8 then an optimal translation may be selected at block 412. The selection of the optimal translation may be arbitrary or may be automated using, for example, tiebreaker rules as depicted in FIG. 1. As described earlier, these tiebreaker rules may include, for example, selecting the translation that requires the smallest movement of the pattern or other criteria for selecting an optimal translation. The selected translation may then be applied to the overall pattern for optimal placement of the pattern on the blank.

Figure 10:
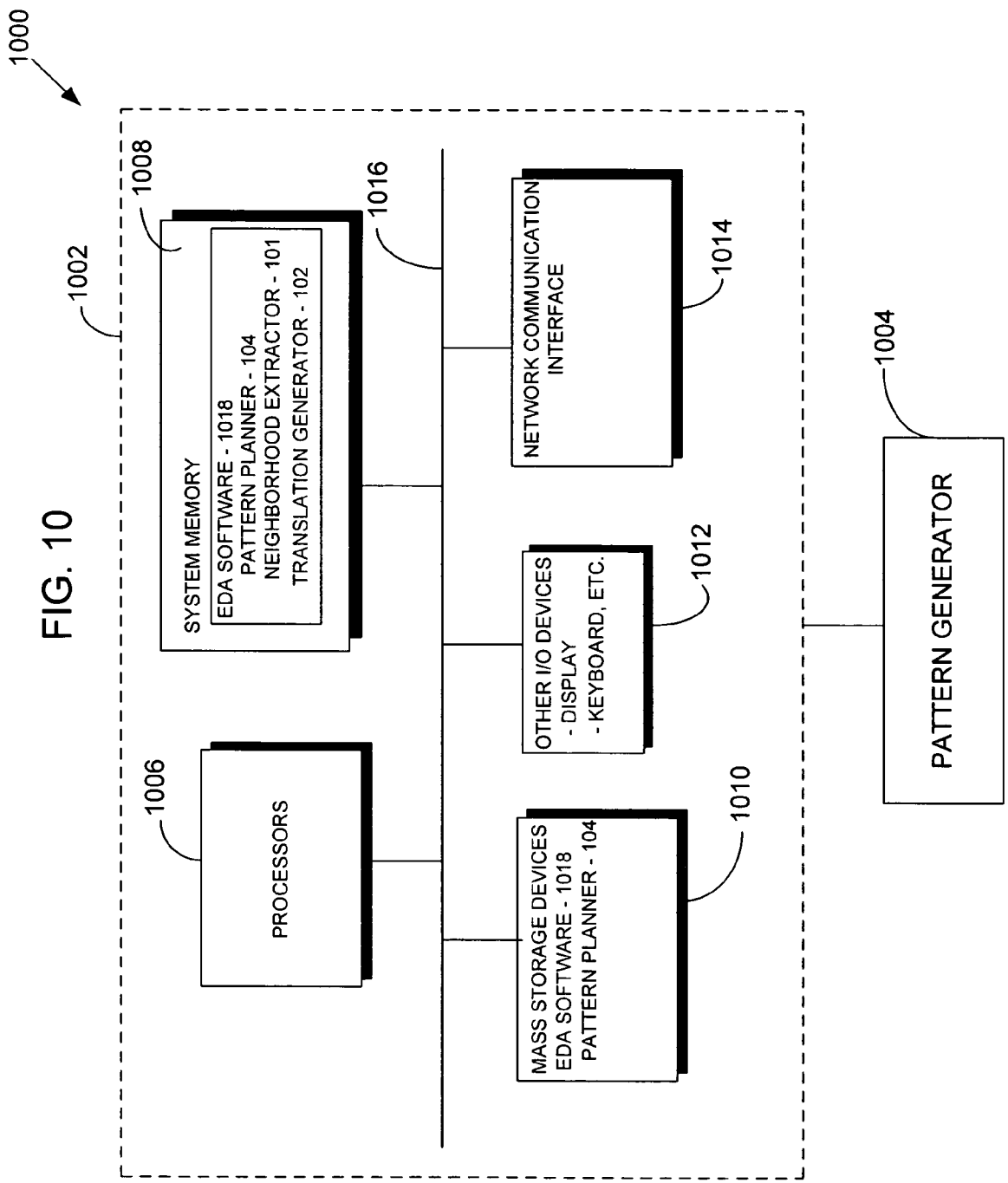
FIG. 10 is a block diagram of a system in accordance with some embodiments.

FIG. 10 depicts an example system for optimally placing a pattern on a mask blank in accordance with some embodiments. For the embodiments, the system 1000 may include a computing device 1002 coupled to a pattern generator 1004 suitable for use to practice the present invention, in accordance with some embodiments. Note that the pattern generator 1004 may be an electron beam pattern generator, a laser pattern generator or other types of pattern generators. As illustrated, the computing device 1002 includes one or more processors 1006, system memory 1008, mass storage devices 1010, other I/O devices 1012 and network communication interface 1014, coupled to each other via system bus 1016 as shown.

The processor 1006 may be employed to execute various electronic design automation (EDA) software components 1018, e.g. pattern planner 104 that includes, for example, neighborhood extractor 101, translation generator 102 and translation selector 103. The processor 1006 may be any one of a number of processors known in the art or to be designed.

The system memory 1008 may be employed to store working copies of EDA software 1018, including pattern planner 104 and operating system services. System memory 1008 may be Dynamic Random Access Memory (DRAM), Synchronous DRAM (SDRAM), or other memory devices of the like.

The mass storage devices 1010 are employed to persistently store data, including, e.g., a persistent copy of EDA software 1018 including pattern planner 104. Examples of mass storage devices 1010 include but are not limited to hard disks, CDROM, DVDROM, and so forth. The mass storage devices 1010 may further be employed to persistently store data related to mask patterns, initial pattern locations, blank data, defect weights, tiebreaker rules, and the like.

Other I/O devices 1012 are employed to facilitate other aspects of input/output. Examples of other I/O devices 1012 include but are not limited to keypads, cursor control, video display, and so forth. The other I/O devices 1012 may further facilitate the reception of data relating to, for example, locations of mask defects and defect weights.

Network communication interface 1014 is employed to facilitate network communication with other devices, e.g., a distribution server of EDA software 1018 (not shown). Network communication interface 1014 may be wire based or wireless. In various embodiments, network communication interface 1014 may support any one of a wide range of networking protocols.

In various embodiments, computing device 1002 may be a desktop computer, a laptop computer, a tablet computer, a palm-sized computing device, a PDA, and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A method, comprising:
receiving by a computing environment, a first mask defect location;
generating in the computing environment a first translation, the generating being based at least in part on said first mask defect location, and the first translation when applied to a pattern results in a first portion of the pattern covering the first defect in part or in totality;
receiving by the computing environment, a second mask defect location, and said generating being further based on the second mask defect location, and the first translation when applied to the pattern further results in a second portion of the pattern covering the second defect in part or in totality;
wherein said generating comprises extracting a first and a second pattern neighborhoods associated with said first and second mask defects; and
wherein said generating further comprises sizing down the first and second pattern neighborhoods.

2. The method of claim 1, wherein said generating further comprises applying a first and a second weight to the first and second pattern neighborhoods respectively.

3. The method of claim 1, wherein said sizing down is based on sizes of the first and second defects.

4. The method of claim 1, wherein said generating further comprises combining the sized down first and second neighborhoods to generate a master neighborhood.

5. The method of claim 4, wherein said generating further comprises determining a plurality of candidate locations on the master neighborhood, and generating the first translation based on a first selected one of the candidate locations.

6. The method of claim 5, wherein said generating further comprises generating a second translation based on a second selected one of the candidate locations.

7. The method of claim 1, wherein the generating further includes generating a second translation based at least in part on the second defect location.

8. The method of claim 7, wherein the generating of the first and second translations comprises applying a first and a second weight to a first and a second pattern neighborhood respectively, the first and second pattern neighborhoods being correspondingly associated with the first and second mask defect locations, and the first weight being greater than the second weight.

9. The method of claim 1 further comprising receiving by the computing environment, pattern data that define a pattern to be imparted onto a blank mask.

10. The method of claim 1, further comprising receiving by the computing environment, an initial pattern location, and said first translation being expressed relative to the initial pattern location.

11. An article of manufacture, comprising:
a recordable medium; and a plurality of machine readable programming instructions recorded on said recordable medium, with the programming instructions designed to enable a computing apparatus to:
- receive a first mask defect location;
- generate a first translation based at least in part on said first mask defect location, the first translation when applied to a pattern results in a first portion of the pattern covering the first defect in part or in totality;
- receive a second mask defect location and perform said generating based at least in part on the second mask defect location, the first translation when applied to the pattern further results in a second portion of the pattern covering the second defect in part or in totality;
- extract a first and a second pattern neighborhoods respectively associated with said first and second mask defects; and
- size down the first and second pattern neighborhoods.

12. The article of claim 11, wherein the programming instructions are further designed to enable the computing apparatus to apply a first and a second weight to the first and second pattern neighborhood, respectively.

13. The article of claim 11, wherein the programming instructions are further designed to enable the computing apparatus to combine the sized down first and second pattern neighborhoods to generate a master neighborhood.

14. The article of claim 13, wherein the programming instructions are further designed to enable the computing apparatus to determine a plurality of candidate locations on the master neighborhood, and to generate the first translation based on a first selected one of the candidate locations.

15. The article of claim 14, wherein the programming instructions are further designed to enable the computing apparatus to generate a second translation based on a second selected one of the candidate locations.

16. The article of claim 11, wherein the programming instructions are further designed to enable the computing apparatus to receive a second mask defect location and generate a second translation based at least in part on the second defect location.

17. An apparatus, comprising:
- a storage medium having stored therein a plurality of programming instructions designed to implement a pattern planner, including capabilities to receive a first mask defect location; generate a first translation based at least in part on said first mask defect location, the first translation when applied to a pattern results in a first portion of the pattern covering the first defect in part or in totality; receive a second mask defect location and perform said generating based at least in part on the second mask defect location, the first translation when applied to the pattern further results in a second portion of the pattern covering the second defect in part or in totality; extract a first and a second pattern neighborhoods respectively associated with said first and second mask defects; and size down the first and second pattern neighborhoods; and
- at least one processor coupled to the storage medium to execute the programming instructions.

18. The apparatus of claim 17, wherein the programming instructions are further designed to implement the pattern planner with the capability to combine the sized down first and second pattern neighborhoods to generate a master neighborhood.

19. The apparatus of claim 18, wherein the programming instructions are further designed to implement the pattern planner with the capability to determine a plurality of candidate locations on the master neighborhood, and to generate the first translation based on a first selected one of the candidate locations.

20. The apparatus of claim 19, wherein the programming instructions are further designed to implement the pattern planner with the capability to generate a second translation based on a second selected one of the candidate locations.

21. The apparatus of claim 17, wherein the programming instructions are further designed to implement the pattern planner with the capability to receive a second mask defect location and generate a second translation based at least in part on the second defect location.

* * * * *